(12) United States Patent
De Coi et al.

(10) Patent No.: US 12,712,542 B2
(45) Date of Patent: Aug. 18, 2026

(54) CHARGE TRANSFER DEVICE HAVING A BULGED PORTION FOR CLOCK FREQUENCIES FROM 100 MHZ

(71) Applicant: ESPROS Photonics AG, Sargans (CH)

(72) Inventors: Beat De Coi, Maienfeld (CH); Chongqi Yu, Bad Ragaz (CH)

(73) Assignee: ESPROS Photonics AG, Sargans (CH)

( * ) Notice: Subject to any disclaimer, the term of this patent is extended or adjusted under 35 U.S.C. 154(b) by 368 days.

(21) Appl. No.: 18/293,631

(22) PCT Filed: Jul. 29, 2022

(86) PCT No.: PCT/EP2022/071382

§ 371 (c)(1),
(2) Date: Jan. 30, 2024

(87) PCT Pub. No.: WO2023/012067

PCT Pub. Date: Feb. 9, 2023

(65) Prior Publication Data

US 2025/0119137 A1 Apr. 10, 2025

(30) Foreign Application Priority Data

Aug. 2, 2021 (EP) .................................... 21189013

(51) Int. Cl.
*H03K 17/56* (2006.01)

(52) U.S. Cl.
CPC .................................... *H03K 17/56* (2013.01)

(58) Field of Classification Search
CPC .............................. H03K 17/56; H10F 39/151
See application file for complete search history.

(56) References Cited

U.S. PATENT DOCUMENTS 5,237,191 A * 8/1993 Yonemoto .............. H10F 39/153 257/249
2009/0075419 A1* 3/2009 Kuriyama .............. H10F 39/151 438/75

FOREIGN PATENT DOCUMENTS

EP 0784346 A2 * 7/1997 .............. H10F 39/15
GB 2551108 A 12/2017

(Continued)

OTHER PUBLICATIONS

International Search Report and Written Opinion for International Application No. PCT/EP2022/071382, dated Oct. 20, 2022, 25 pages.

(Continued)

*Primary Examiner* — William B Partridge
*Assistant Examiner* — Felix B Andrews
(74) *Attorney, Agent, or Firm* — Christopher J. Volkmann; KELLY, HOLT & CHRISTENSON PLLC

(57) ABSTRACT

A charge transfer device having a charge transfer channel in a semiconductor substrate. The charge transfer channel is formed by overlap of the possible electrostatic effect of the gates with the conduction layer. A clock generator has a clock frequency of more than 100 MHz which applies changes in potential at the clock frequency to the gates, for transporting charge carriers at the clock frequency from adjacent regions of the overlap between adjacent gates and the conduction layer. The charge transfer channel in the region of one gate has a region of a constriction in which the cross-section in the flow direction decreases, and is arranged at least in the region of the gate upstream of the region of the protuberance or in the regions of the gate upstream of the protuberance and the adjoining gate of the protuberance.

20 Claims, 2 Drawing Sheets

(56) References Cited

FOREIGN PATENT DOCUMENTS

| | | | | |
|---|---|---|---|---|
| JP | 2006278465 | A | * | 10/2006 |
| JP | 2015115391 | A | * | 6/2015 |

OTHER PUBLICATIONS

Search Report Written Opinion for PCT Application No. PCT/EP2022/071379, dated Oct. 20, 2022, 15 pages.
Search Report for European Patent Application No. 21189013.2. dated Jan. 13, 2022, 12 pages.
International Preliminary Report on Patentability for PCT Application No. PCT/EP2022/071382, dated Feb. 6, 2024, 10 pages.

* cited by examiner

CHARGE TRANSFER DEVICE HAVING A BULGED PORTION FOR CLOCK FREQUENCIES FROM 100 MHZ

CROSS-REFERENCES TO RELATED APPLICATIONS

This Application is a Section 371 National Stage Application of International Application No. PCT/EP2022/071382, filed Jul. 29, 2022, and published as WO 2023/012067 A1 on Feb. 9, 2023, and claims priority to European Application No. 21189013.2 filed Aug. 2, 2021; the contents of these applications are hereby incorporated by reference in their entirety.

BRIEF DESCRIPTION OF THE DRAWINGS

Exemplary embodiments are illustrated in the drawings and are explained in greater detail below. In this case, identical reference signs in the individual figures designate elements which correspond to one another.

DETAILED DESCRIPTION

Figure 1:
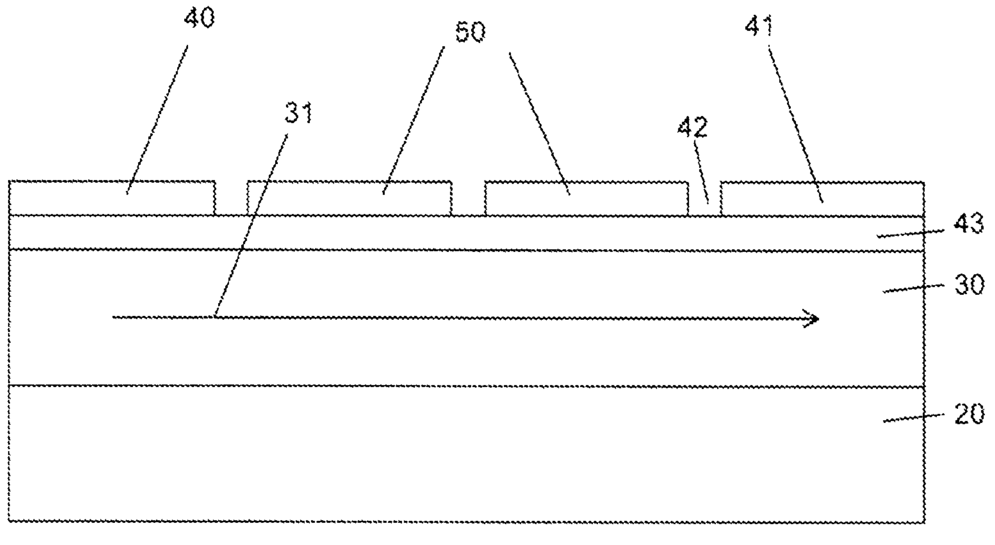
FIG. 1 shows a conduction transfer channel in side view along flow direction, in one example.

The present disclosure relates to a semiconductor structure having a charge transfer channel for clock frequencies in the range starting from 100 MHz, preferably 250 MHz, particularly preferably up to 400 MHz.

At clock frequencies of more than 100 MHz, especially more than 250 MHz and in particular up to 400 MHz, losses may increasingly occur when transporting the charge carriers through a charge transfer channel.

It is an object of the present disclosure to provide improved charge transfer at clock frequencies of more than 100 MHz, preferably starting from 250 MHz, particularly preferably up to 400 MHz.

Proceeding from a semiconductor structure of the type mentioned in the introduction, the object is achieved by means of features described herein. Advantageous embodiments and developments of the present disclosure are possible by virtue of the measures mentioned herein.

The charge transfer device according to the present disclosure uses a charge carrier channel, inter alia. A charge transfer channel can be an overlap of the possible electrostatic effect of mutually adjoining gates with a conduction layer in a semiconductor. The charge transfer channel can thus be the intersection volume from the projection of the electrostatic effect of the gates onto the volume structure of the conduction layer.

The conduction layer, in which the charge carrier transport or charge carrier transfer takes place, can be situated in a semiconductor substrate and can be doped differently than the surrounding semiconductor substrate, with the result that charge carriers can move in the conduction layer and do not escape into the surrounding semiconductor substrate. A conduction layer can be buried or situated on the surface of the semiconductor substrate.

The gates can be electrodes which are arranged along the conduction layer and are separated from the conduction layer by a thin, nonconducting separating layer, with the result that a change in potential at the gates takes effect as a change in the electric field in the overlappingly assigned region of the conduction layer. The gates can be situated on the semiconductor substrate in a manner insulated by a thin separating layer.

Charge carriers can be electrons or holes.

Corresponding changes in potential at adjoining gates enable charge carriers to be transported in the charge transfer channel, with the result that the charge transfer channel can act as a conduction channel for a directional flow of charge carriers. The change in potential generally follows a clock frequency. The changes in potential can follow a clock frequency in this case. The clock frequency determines the rate of charge transport and thus the temporal resolution and performance of surrounding or connected systems such as sensors or computing units, for instance.

The boundaries, shape and course of the gates, the conduction layer and the charge transfer channel are always specified from the gates in the direction of the conduction layer in plan view, unless stated otherwise in an individual case. The course of the charge transfer channel and spatial relations are always specified in the direction of the charge carrier flow in the charge transfer channel, unless stated otherwise in an individual case.

If the width of the course of the juxtaposed gates is narrower than the width of the course of the assigned conduction layer, then the boundaries of the width of the course of the charge transfer channel are given by the boundaries of the course of the width of the juxtaposed gates. If the width of the course of the juxtaposed gates is wider than the width of the course of the assigned conduction layer, then the boundaries of the width of the course of the charge transfer channel are given by the boundaries of the course of the width of the assigned conduction layer.

It has been recognized in connection with the present disclosure that at relatively high clock frequencies starting from 100 MHz or 250 MHz, some of the charge carriers situated below a gate, in the event of a corresponding change in potential, often do not cross to the next gate as desired; advantageously, this effect can be reduced or avoided by means of the charge transfer device according to one example.

The charge transfer device according to one example is a charge transfer device having a charge transfer channel in a semiconductor substrate having a doped conduction layer for movably accepting the charge carriers, having a sequence of at least two electrically isolated gates which adjacently succeed one another for transferring the charge carriers in the conduction layer in a flow direction, wherein the charge transfer channel is formed by overlap of the possible electrostatic effect of the gates with the conduction layer, and having a clock generator having a clock frequency of more than 100 MHz, in particular more than 150 MHz, more than 200 MHz or approximately or more than 250 MHz and in particular up to 300 MHz or 400 MHz, which applies changes in potential at the clock frequency to the gates, for transporting charge carriers at the clock frequency from adjacent regions of the overlap between adjacent gates and the conduction layer, which corresponds to the transport via a CCD structure, wherein the charge transfer channel and in particular one gate or the sequence of two adjoining gates has a region of a protuberance in which the cross-section in the flow direction first increases (in particular by more than 20%, 40%, 80% or 100%) and then decreases again (in particular by more than 20%, 40%, or 80%) and which is arranged in a manner extending over the region of one or two mutually adjoining gates, and has a region of a constriction in which the cross-section in the flow direction decreases, and in particular decreases continuously, in particular in a constant fashion, and is arranged at least in the region of the gate upstream of the region of the protuberance or in the regions of the gate upstream of the protuberance and the adjoining gate of the protuberance.

This charge transfer channel according to one example can afford the advantage that charge carriers can flow with less resistance and/or fewer losses.

Preferably, in order to limit the losses, the region of the constriction is arranged upstream of the protuberance at a distance of less than the maximum width of the region of the protuberance, in particular at a distance of less than ½, ¼, or ⅛ of the width of the protuberance, and in particular adjoins the protuberance directly upstream of the protuberance.

Preferably, the region of the constriction is embodied as beveled in the flow direction and in particular is embodied as funnel-shaped, in order to attain as continuous a flow as possible.

In addition, the resistance can be reduced in each case by the following measures:

Preferably, the region of the protuberance has a length of less than ½, in particular less than ¼, in particular less than ⅛, of the maximum width.

Preferably, the region of the protuberance has a maximum width whose ratio to the width of the conduction channel upstream of the constriction or downstream of the protuberance is more than around 110%, 120%, 130%, 140%, or 150%, and/or is less than 200%, 180%, or 160%.

Preferably, the constriction reduces the spillback or the flow resistance or the loss of the charge carriers in the protuberance.

FIG. 1 shows a charge transfer channel 10 in side view along the flow direction 31 of the charge carriers in the following figures. The construction is analogous to CCD technology. The surrounding semiconductor substrate 20 is p+ doped. A buried conduction layer 30 is arranged in the semiconductor substrate 20. The conduction layer is weakly n-doped. This has the consequence that electrons as charge carriers are freely mobile in the conduction layer and do not penetrate into the semiconductor substrate. An insulation layer 43 is applied on the conduction layer and gates 40, 41, 50 composed of metal are arranged on said insulation layer. The gates are electrically isolated from one another by interspaces. The clock generator (not illustrated) applies a positive potential at a clock frequency of 250 MHz alternately to the adjacent gates, with the result that conduction electrons in the conduction layer are attracted from one gate to the next and are thus transferred in the flow direction. The clock frequency could also be only more than 100 MHz, more than 150 MHz or more than 200 MHz. In general, the clock frequency is not higher than 300 MHz. The conduction electrons can be for example photoinduced electrons from an image sensor connected to the conduction channel.

The semiconductor substrate 20 is p+ doped and the conduction layer 30 is n-doped. The insulation layer 43 is composed of SiO2 and the gates are formed from metal.

Figure 2:
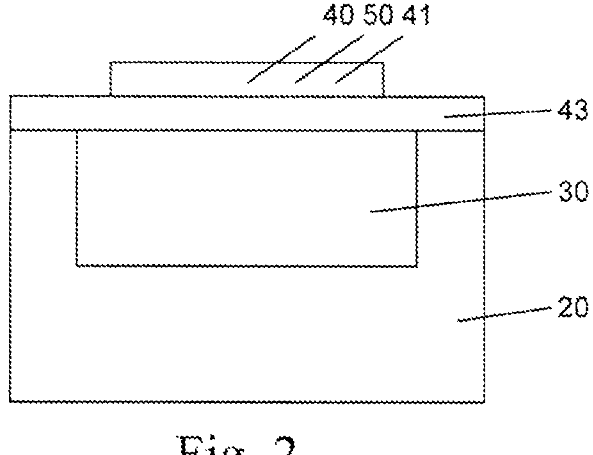
FIG. 2 shows a conduction transfer channel in side view perpendicular to flow direction, in one example.

FIG. 2 shows the charge transfer channel in side view perpendicular to the flow direction of the charge carriers in the following figures. The conduction layer 30 is buried, and so it is encompassed from above and laterally by the semiconductor substrate 20. Semiconductor substrate 20 and conduction layer 30 are provided with an insulation layer toward the top. The gates 40, 41, 50 are arranged on the insulation layer 43 in the region above the conduction layer 30. The gates are embodied as narrower than the conduction layer in the width extent along the flow direction.

Figure 3:
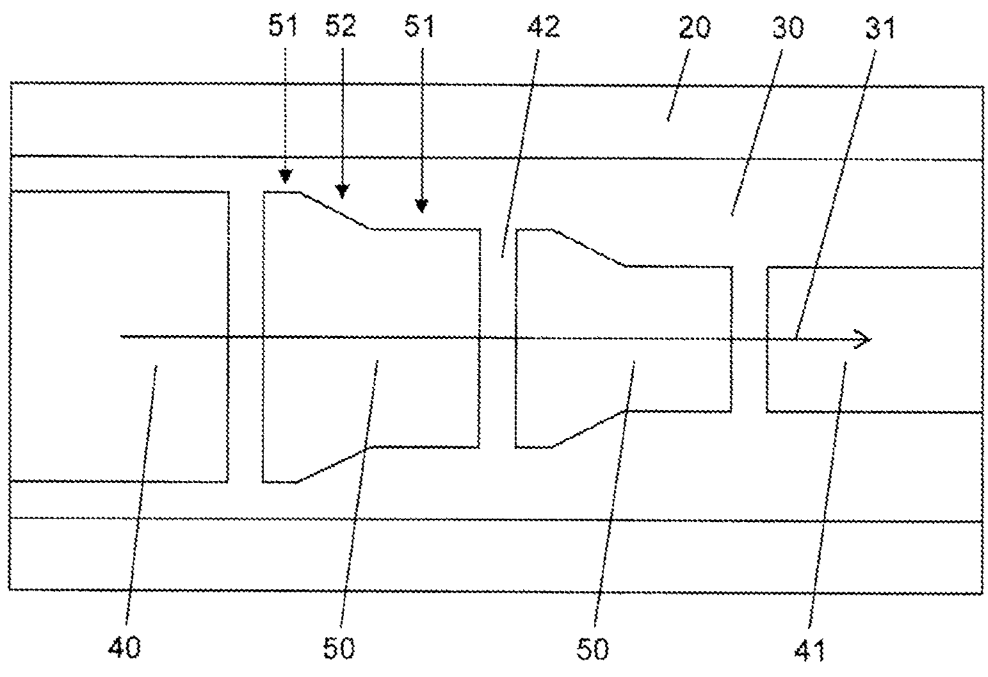
FIG. 3 shows a conduction transfer channel with constriction in plan view, in one example.

FIG. 3 shows a charge transfer channel in plan view. The conduction layer 30 is embedded in the semiconductor substrate 20. The overlying insulation layer is not shown. Above the region of the conduction layer 30, in a manner separated by the insulation layer (not shown), the gates 40, 50, 41 are arranged in an electrically isolated manner in flow direction 31 of the electrons and with spacings 42. Overall, the gates exhibit a constriction of the cross-section in the flow direction. The first gate 40 has a wide cross-section, while the last gate 41 has a comparatively narrower cross-section. The two gates 50 have a narrowing cross-section in flow direction 31. The narrowing gate 50 has, in flow direction 31, firstly a wide region with constant cross-section without constriction 51, then a cross-sectionally narrowing region with constriction 52 and thereupon a narrower region with once again constant cross-section without constriction 51. In this case, the gate 50 has regions with constant cross-section at the transition to the adjacent gates. The region arranged counter to the flow direction with constant cross-section without constriction is shorter than the region arranged in the flow direction with constant cross-section without constriction. As a result, the narrowing region with constriction 52 is arranged in a manner displaced from the center of the gate 50 counter to the direction of the flow direction. The narrowing region with constriction 52 is embodied as beveled on both sides, with the result that it has a funnel-shaped shape. The embodiment of a constriction thus shown makes it possible to minimize the spillback and/or the flow resistance and/or the losses of the charge carriers in the flow direction.

Figure 4:
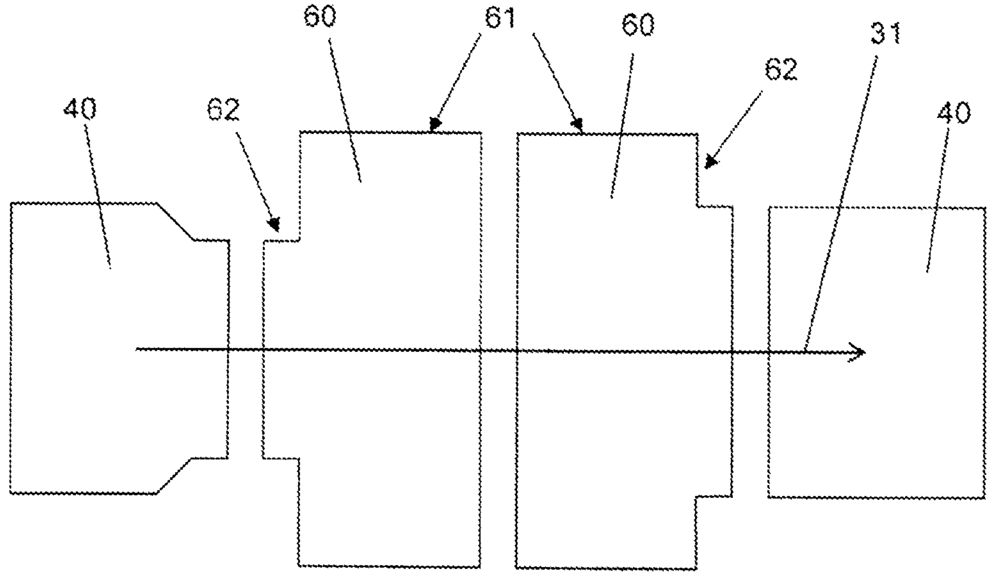
FIG. 4 shows gates of a charge transfer channel in plan view, in one example.

FIG. 4 shows the gates of a charge transfer channel in plan view. The maximum width of the gates 40 situated at the beginning and end of the gate sequence shown in the flow direction forms the typical width of the cross-section of the conduction transfer channel. By contrast, the two gates 60 have a continuous region of a protuberance 61, in the case of which the cross-section is enlarged by the width 62 approximately 25% in comparison with the typical width. Directly at the protuberance, the first gate 60 having the protuberance has a constriction 62, at which the cross-section of the charge transfer channel is narrower in comparison with the typical width. As a result, the entry into the protuberance is narrower than the exit from the protuberance. The constriction 62 is already embodied at the preceding gate 40 in the flow direction, which gate, by virtue of a funnel-shaped region, reduces the cross-section from the typical cross-section to the reduced cross-section of the constriction. The embodiment of a protuberance thus shown makes it possible to minimize the spillback and/or the flow resistance and/or the losses of the charge carriers in the flow direction.

Although the present invention has been described with reference to preferred embodiments, workers skilled in the art will recognize that changes may be made in form and detail without departing from the spirit and scope of the invention.

LIST OF REFERENCE SIGNS

10 Charge transfer channel
20 Semiconductor substrate
30 Conduction layer
31 Flow direction
40 Gate, wide
41 Gate, narrow 42 Insulating spacing between the gates
43 Insulation layer
50 Gate with constriction
51 Region without constriction
52 Region with constriction
60 Gate with protuberance
61 Region with protuberance
62 Width of the protuberance
62 Constriction

The invention claimed is:

1. A charge transfer device
having a charge transfer channel in a semiconductor substrate
having a doped conduction layer
for movably accepting the charge carriers,
having a sequence of at least two electrically isolated gates
which adjacently succeed one another
for transferring the charge carriers in the conduction layer in a flow direction,
wherein the charge transfer channel is formed by overlap of the possible electrostatic effect of the gates with the conduction layer,
and having a clock generator
having a clock frequency of more than 100 MHz,
which applies changes in potential at the clock frequency to the gates,
for transporting charge carriers at the clock frequency from adjacent regions of the overlap between adjacent gates and the conduction layer,
wherein
the charge transfer channel
and one gate or the sequence of two adjoining gates
has a region of a protuberance
in which the cross-section in the flow direction first increases by more than 20% and then decreases by more than 20%, and
which is arranged in a manner extending over the region of one or two mutually adjoining gates, and
has a region of a constriction
in which the cross-section in the flow direction decreases continuously in a constant fashion, and
is arranged at least in the region of the gate upstream of the region of the protuberance or in the regions of the gate upstream of the protuberance and the adjoining gate of the protuberance.

2. The charge transfer channel as claimed in claim 1, wherein
the region of the constriction
is embodied as beveled in the flow direction
and is embodied as funnel-shaped.

3. The charge transfer channel as claimed in claim 1, wherein
the constriction reduces the spillback or the flow resistance or the loss of the charge carriers in the protuberance.

4. The charge transfer channel as claimed in claim 1, wherein
the semiconductor substrate is p+ doped, and/or
the conduction layer is weakly n− doped, and/or
the gates are formed from metal, and/or
a nonconducting layer is arranged between the gates and the conduction layer, and/or
the gates are separated in a manner electrically insulated from one another.

5. The charge transfer channel as claimed in claim 1, wherein the cross-section in the flow direction first increases by more than 40% and then decreases by more than 40%.

6. The charge transfer channel as claimed in claim 1, wherein the cross-section in the flow direction first increases by more than 80%.

7. The charge transfer channel as claimed in claim 1, wherein the cross-section in the flow direction first increases by more than 100%.

8. The charge transfer channel as claimed in claim 1, wherein
the region of the constriction
is arranged upstream of the protuberance at a distance of less than the maximum width of the region of the protuberance at a distance of less than one-half of the width of the protuberance, and
adjoins the protuberance directly upstream of the protuberance.

9. The charge transfer channel as claimed in claim 8, wherein the region of the constriction
is arranged upstream of the protuberance at a distance of less than one-fourth of the width of the protuberance.

10. The charge transfer channel as claimed in claim 1, wherein
the region of the protuberance
has a length of less than one-half of the maximum width.

11. The charge transfer channel as claimed in claim 10, wherein the length of the region of the protuberance is less than one-fourth of the maximum width.

12. The charge transfer channel as claimed in claim 10, wherein the length of the region of the protuberance is less than one-eighth of the maximum width.

13. The charge transfer channel as claimed in claim 1, wherein
the region of the protuberance
has a maximum width whose ratio to the width of the conduction channel upstream of the constriction or downstream of the protuberance
is more than around 110%, and/or
is less than 200%.

14. The charge transfer channel as claimed in claim 2, wherein the ratio of the maximum width of the region of the protuberance to the width of the conduction channel upstream of the constriction or downstream of the protuberance
is more than around 130%, and/or
is less than 180%.

15. The charge transfer channel as claimed in claim 13, wherein the ratio of the maximum width of the region of the protuberance to the width of the conduction channel upstream of the constriction or downstream of the protuberance
is more than around 150%, and/or
is less than 160%.

16. The charge transfer channel as claimed in claim 1, wherein the clock frequency is more than 150 MHz.

17. The charge transfer channel as claimed in claim 16, wherein the clock frequency is more than 200 MHz.

18. The charge transfer channel as claimed in claim 17, wherein the clock frequency is more than 250 MHz.

19. The charge transfer channel as claimed in claim 18, wherein the clock frequency is more than 300 MHz.

20. The charge transfer channel as claimed in claim 19, wherein the clock frequency is more than 400 MHz.

* * * * *